United States Patent
Dahlen et al.

(10) Patent No.: US 7,010,768 B2
(45) Date of Patent: Mar. 7, 2006

(54) TRANSMISSION LINE BOUNDING MODELS

(75) Inventors: Paul Eric Dahlen, Rochester, MN (US); Roger John Gravrok, Eau Claire, WI (US); David Loren Heckmann, Grand Forks, ND (US); Mark Owen Maxson, Mantorville, MN (US)

(73) Assignee: International Business Machines Corporation, Armonk, NY (US)

( * ) Notice: Subject to any disclaimer, the term of this patent is extended or adjusted under 35 U.S.C. 154(b) by 353 days.

(21) Appl. No.: 10/463,282

(22) Filed: Jun. 17, 2003

(65) Prior Publication Data

US 2004/0261045 A1    Dec. 23, 2004

(51) Int. Cl.
*G06F 9/45*    (2006.01)
(52) U.S. Cl. .................. 716/6; 716/5; 703/14
(58) Field of Classification Search ........... 716/2–8; 322/12, 20, 22; 703/14; 323/234–303
See application file for complete search history.

(56) References Cited

U.S. PATENT DOCUMENTS

| | | | | |
|---|---|---|---|---|
| 4,539,539 A | * | 9/1985 | Schweiger et al. | 335/78 |
| 6,215,373 B1 | * | 4/2001 | Novak et al. | 333/22 R |
| 6,441,695 B1 | * | 8/2002 | Flake | 333/20 |
| 6,546,528 B1 | * | 4/2003 | Sasaki et al. | 716/5 |
| 6,621,155 B1 | * | 9/2003 | Perino et al. | 257/686 |
| 2003/0084415 A1 | * | 5/2003 | Sasaki et al. | 716/4 |

* cited by examiner

*Primary Examiner*—Stacy A. Whitmore
*Assistant Examiner*—Nghia M. Doan
(74) *Attorney, Agent, or Firm*—Owen J. Gamon

(57) ABSTRACT

A method, apparatus, system, and signal-bearing medium that in an embodiment select a subset of transmission line models based on bounding electrical criteria. The bounding electrical criteria may include combinations of maximum and minimum values and in an embodiment may also include nominal values. Models that meet the bounding electrical criteria may be used in modeling the transmission line while models that do not meet the bounding electrical criteria are not used.

16 Claims, 3 Drawing Sheets

TRANSMISSION LINE BOUNDING MODELS

LIMITED COPYRIGHT WAIVER

A portion of the disclosure of this patent document contains material to which the claim of copyright protection is made. The copyright owner has no objection to the facsimile reproduction by any person of the patent document or the patent disclosure, as it appears in the U.S. Patent and Trademark Office file or records, but reserves all other rights whatsoever.

FIELD

This invention generally relates to modeling transmission lines and more specifically to modeling transmission lines using a bounding electrical criteria.

BACKGROUND

The development of the EDVAC computer system of 1948 is often cited as the beginning of the computer era. Since that time, computer systems have evolved into extremely sophisticated devices, and computer systems may be found in many different settings. Computer systems typically include a combination of hardware, such as semiconductors and printed circuit boards, and software, also known as computer programs.

Printed circuit boards typically contain discrete elements (such as chips, transistors, resistors, capacitors, and inductors) connected by bonding metallic wires, often called transmission lines. These transmission lines play a significant role in determining important characteristics of the printed circuit board, such as the size, power consumption, speed, reliability, and clock frequency of the printed circuit board. Because the transmission lines are so important, developers of printed circuit boards study the impact of the transmission lines on the aforementioned characteristics prior to actually manufacturing the printed circuit board. One way to accomplish this study is via a transmission line model.

For a transmission line model to be useful, it must accurately represent the actual printed circuit board that will eventually be manufactured. This accuracy can be compromised when a buyer uses multiple suppliers of printed circuit boards. Each supplier has its own unique manufacturing process and its own unique set of manufacturing tolerances, which can cause differences in the transmission line characteristics of printed circuit boards produced by different suppliers. Despite the problems that these differences can cause, buyers wish to use multiple suppliers in order to reduce the cost and risk exposure in the production and procurement of the printed circuit boards used in the building of a computer or other electronic device.

Thus, the developer of the transmission line model needs to account for the differences in printed circuit boards that may come from multiple suppliers. Typically, model developers have developed worst-case models, which cover the extreme values of manufacturing and material tolerances from the multiple vendors. These worst-case models have led to transmission line models that are generally overly conservative, sacrificing valuable performance and risking increased cost.

Without a better way to design a printed circuit board that is optimal instead of worst-case, printed circuit boards will continue to suffer from lowered performance and increased cost. Although the aforementioned problems have been described in the context of printed circuit boards, they apply equally to any other environment where transmission lines are modeled, such as flex cables, coaxial cables, chip packages, organic chip carriers, and fiber optics.

SUMMARY

A method, apparatus, system, and signal-bearing medium are provided that in an embodiment select a subset of transmission line models based on bounding electrical criteria. The bounding electrical criteria may include combinations of maximum and minimum values and in an embodiment may also include nominal values. Models that meet the bounding electrical criteria may be used in modeling the transmission line while models that do not meet the bounding electrical criteria are not used.

DETAILED DESCRIPTION

Figure 1:
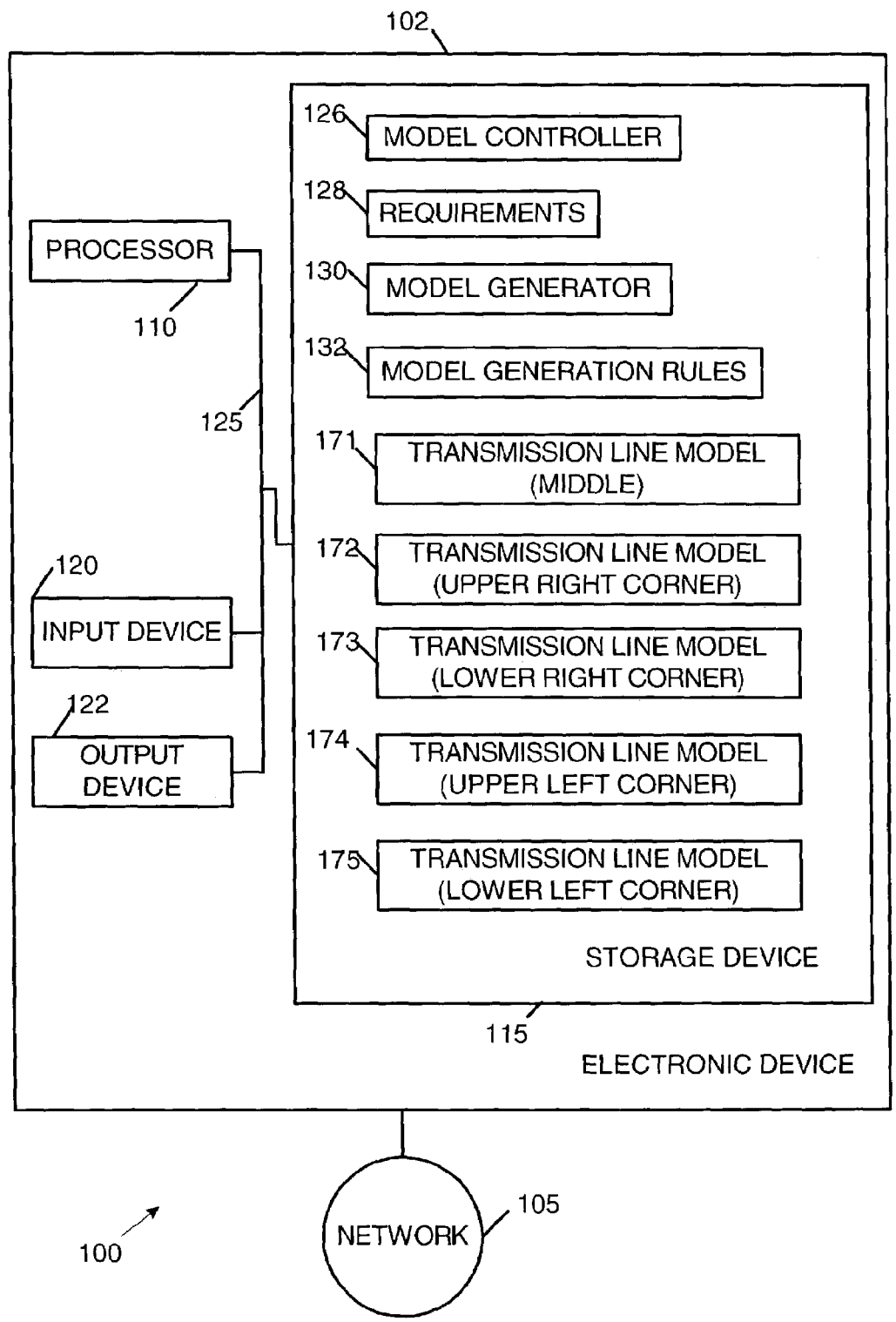
FIG. 1 depicts a block diagram of an example system for implementing an embodiment of the invention.

FIG. 1 depicts a block diagram of an example system 100 for implementing an embodiment of the invention. The system 100 includes an electronic device 102 connected to a network 105. Although only one electronic device 102 and one network 105 are shown, in other embodiments any number or combination of them may be present. In another embodiment, the network 105 is not present.

The electronic device 102 includes a processor 110, a storage device 115, an input device 120, and an output device 122, all connected directly or indirectly via a bus 125. The processor 110 represents a central processing unit of any type of architecture, such as a CISC (Complex Instruction Set Computing), RISC (Reduced Instruction Set Computing), VLIW (Very Long Instruction Word), or a hybrid architecture, although any appropriate processor may be used. The processor 110 executes instructions and includes that portion of the electronic device 102 that controls the operation of the entire electronic device. Although not depicted in FIG. 1, the processor 110 typically includes a control unit that organizes data and program storage in memory and transfers data and other information between the various parts of the electronic device 102. The processor 110 reads and/or writes code and data to/from the storage device 115, the network 105, the input device 120, and/or the output device 122.

Although the electronic device 102 is shown to contain only a single processor 110 and a single bus 125, embodiments of the present invention apply equally to electronic devices that may have multiple processors and multiple buses with some or all performing different functions in different ways.

The storage device 115 represents one or more mechanisms for storing data. For example, the storage device 115 may include read only memory (ROM), random access memory (RAM), magnetic disk storage media, hard disk media, floppy disk media, tape media, CD (compact disk) media, DVD (digital video disk) media, optical storage media, flash memory devices, and/or other machine-readable media. In other embodiments, any appropriate type of storage device may be used. Although only one storage device 115 is shown, multiple storage devices and multiple types of storage devices may be present. Further, although the electronic device 102 is drawn to contain the storage device 115, the storage device 115 may be external to the electronic device 102 and/or may be distributed across other electronic devices, such as devices connected to the network 105.

The storage device 115 includes a model controller 126, requirements data 128, a model generator 130, model generation rules 132, a transmission line model (middle) 171, a transmission line model (upper right corner) 172, a transmission line model (lower right corner) 173 a transmission line model (upper left corner) 174, and a transmission line model (lower left corner) 175, all of which may in various embodiments have any number of instances.

The model controller 126 creates the models 171, 172, 173, 174, and 175 using the transmission-line requirements data 128, the model generator 130, and the model generation rules 132. In an embodiment, the model controller 126 includes instructions capable of executing on the processor 10 or statements capable of being interpreted by instructions executing on the processor 110 to carry out the functions as further described below with reference to FIG. 3. In another embodiment, the model controller 126 may be implemented in hardware via logic gates and/or other appropriate hardware techniques in lieu of or in addition to a processor-based system.

The transmission-line requirements data 128 may include structural requirements, such as material properties and physical dimensions that vendors of the printed circuit board or other appropriate product supply. The transmission-line requirements data 128 may also include electrical requirements, such as impendence (Zo) and gamma (alpha and Td) that are supplied by the customer of the vendor.

The model generator 130 generates the models 171, 172, 173, 174, and 175 based on the requirements 128, the model generation rules 132, and input parameters from the model controller 126. In an embodiment, the model generator 130 includes instructions capable of executing on the processor 110 or statements capable of being interpreted by instructions executing on the processor 110 to carry out the functions as further described below with reference to FIG. 3. In another embodiment, the model generator 130 may be implemented in hardware via logic gates and/or other appropriate hardware techniques in lieu of or in addition to a processor-based system.

The model generation rules 132 contain characteristics of the design of the printed circuit board and its transmission lines, which the model generator 130 uses to create the transmission line models 171, 172, 173, 174, and 175.

The models 171, 172, 173, 174, and 175 represent models of transmission line designs of printed circuit boards that have boundary conditions. Examples of boundary conditions include various combinations of high and low attenuation and impedance, but in other embodiments any appropriate boundary conditions may be used. The models 171, 172, 173, 174, and 175 define a middle and four corners, respectively, of a 2-dimensional model space, as further described below with reference to FIG. 2. But, in other embodiments any number of models may be present to describe the boundary conditions of an n-dimensional model space, as further described below with reference to FIG. 2.

Although the model controller 126, the model generator 130, and the model generation rules 132 are illustrated as being separate entities, in other embodiments some or all of them may be packaged together. Although the model controller 126, the transmission-line requirements data 128, the model generator 130, the model generation rules 132, and the models 171, 172, 173, 174, and 175 are all illustrated as being contained within the storage device 115 in the electronic device 102, in other embodiments some or all of them may be on different electronic devices and may be accessed remotely, e.g., via the network 105.

The input device 120 may be a keyboard, mouse or other pointing device, trackball, touchpad, touchscreen, keypad, microphone, voice recognition device, or any other appropriate mechanism for the user to input data to the electronic device 102 and/or to manipulate the user interfaces of the electronic device 102. Although only one input device 120 is shown, in another embodiment any number and type of input devices may be present.

The output device 122 is that part of the electronic device 102 that presents output to the user. The output device 122 may be a cathode-ray tube (CRT) based video display well known in the art of computer hardware. But, in other embodiments the output device 122 may be replaced with a liquid crystal display (LCD) based or gas, plasma-based, flat-panel display. In still other embodiments, any appropriate display device may be used. In other embodiments, a speaker or a printer may be used. In other embodiments any appropriate output device may be used. Although only one output device 122 is shown, in other embodiments, any number of output devices of different types or of the same type may be present.

The bus 125 may represent one or more busses, e.g., PCI (Peripheral Component Interconnect), ISA (Industry Standard Architecture), X-Bus, EISA (Extended Industry Standard Architecture), or any other appropriate bus and/or bridge (also called a bus controller).

The electronic device 102 may be implemented using any suitable hardware and/or software, such as a personal computer. Portable computers, laptop or notebook computers, PDAs (Personal Digital Assistants), pocket computers, telephones, pagers, automobiles, teleconferencing systems, appliances, and mainframe computers are examples of other possible configurations of the electronic device 102. The hardware and software depicted in FIG. 1 may vary for specific applications and may include more or fewer elements than those depicted. For example, other peripheral devices such as audio adapters, or chip programming devices, such as EPROM (Erasable Programmable Read-Only Memory) programming devices may be used in addition to or in place of the hardware already depicted.

The network 105 may be any suitable network or combination of networks and may support any appropriate protocol suitable for communication of data and/or code to/from the electronic device 102. In various embodiments, the network 105 may represent a storage device or a combination of storage devices, either connected directly or indirectly to the electronic device 102. In an embodiment, the network 105 may support Infiniband. In another embodiment, the network 105 may support wireless communications. In another embodiment, the network 105 may support hard-wired communications, such as a telephone line or cable. In another embodiment, the network 105 may support the Ethernet IEEE (Institute of Electrical and Electronics Engineers) 802.3x specification. In another embodiment, the network 105 may be the Internet and may support IP (Internet Protocol). In another embodiment, the network 105 may be a local area network (LAN) or a wide area network (WAN). In another embodiment, the network 105 may be a hotspot service provider network. In another embodiment, the network 105 may be an intranet. In another embodiment, the network 105 may be a GPRS (General Packet Radio Service) network. In another embodiment, the network 105 may be any appropriate cellular data network or cell-based radio network technology. In another embodiment, the network 105 may be an IEEE 802.11B wireless network. In still another embodiment, the network 105 may be any suitable network or combination of networks. Although one network 105 is shown, in other embodiments any number of networks (of the same or different types) may be present.

The various software components illustrated in FIG. 1 and implementing various embodiments of the invention may be implemented in a number of manners, including using various computer software applications, routines, components, programs, objects, modules, data structures, etc., referred to hereinafter as "computer programs," or simply "programs." The computer programs typically comprise one or more instructions that are resident at various times in various memory and storage devices in the electronic device 102, and that, when read and executed by one or more processors in the electronic device 102, cause the electronic device to perform the steps necessary to execute steps or elements embodying the various aspects of an embodiment of the invention.

Moreover, while embodiments of the invention have and hereinafter will be described in the context of fully functioning electronic devices, the various embodiments of the invention are capable of being distributed as a program product in a variety of forms, and the invention applies equally regardless of the particular type of signal-bearing medium used to actually carry out the distribution. The programs defining the functions of this embodiment may be delivered to the electronic device 102 via a variety of signal-bearing media, which include, but are not limited to:

(1) information permanently stored on a non-rewriteable storage medium, e.g., a read-only memory device attached to or within an electronic device, such as a CD-ROM readable by a CD-ROM drive;

(2) alterable information stored on a rewriteable storage medium, e.g., a hard disk drive or diskette; or (3) information conveyed to an electronic device by a communications medium, such as through a computer or a telephone network, e.g., the network 105, including wireless communications.

Such signal-bearing media, when carrying machine-readable instructions that direct the functions of the present invention, represent embodiments of the present invention.

In addition, various programs described hereinafter may be identified based upon the application for which they are implemented in a specific embodiment of the invention. But, any particular program nomenclature that follows is used merely for convenience, and thus embodiments of the invention should not be limited to use solely in any specific application identified and/or implied by such nomenclature.

The exemplary environments illustrated in FIG. 1 are not intended to limit the present invention. Indeed, other alternative hardware and/or software environments may be used without departing from the scope of the invention.

Figure 2:
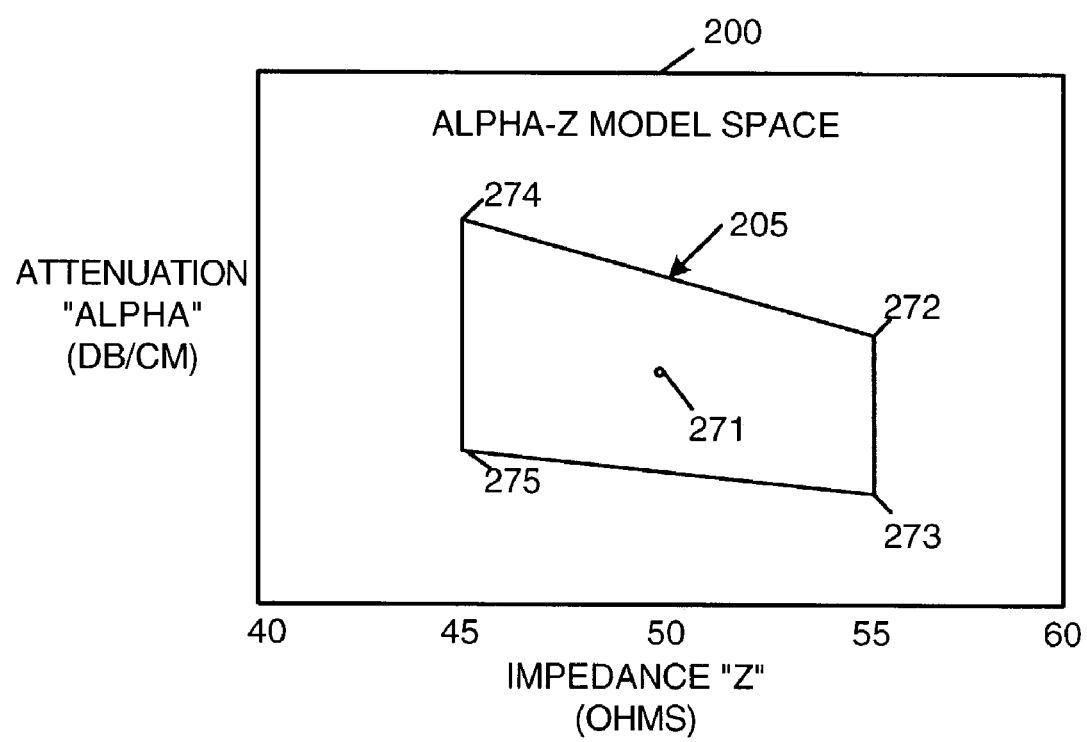
FIG. 2 depicts a pictorial representation of an example model space, according to an embodiment of the invention.

FIG. 2 depicts a pictorial representation of an example alpha-Z model space 200, according to an embodiment of the invention. Attenuation (alpha) is shown on the vertical axis of the model space 200 and is expressed in the example shown in units of decibels per centimeter (dB/cm). Impedance (z) is shown on the horizontal axis of the model space 200 and is expressed in the example shown in ohms. The model space 200 is shown with gradients of 40, 45, 50, 55, and 60 ohms on the horizontal axis, but in other embodiments any gradients and values may be used.

The alpha-Z model space 200 includes a region 205 having four corners 272, 273, 274, and 275. The corner 272 corresponds to a transmission line design on a printed circuit board represented by the model 172, which has a high impedance and a high attenuation. The corner 273 corresponds to a transmission line design on a printed circuit board represented by the model 173, which has a high impedance and a low attenuation. The corner 274 corresponds to a transmission line design on a printed circuit board represented by the model 174, which has a low impedance and a high attenuation. The corner 275 corresponds to a transmission line design on a printed circuit board represented by the model 175, which has a low impedance and a low attenuation.

The region 205 further has a mid-point 271, which corresponds to a transmission line design on a printed circuit board represented by the model 171, which has a middle impedance and a middle attenuation.

The four corners 272, 273, 274, and 275 represent respective combinations of minimum and/or maximum electrical criteria (attenuation and impedance in this example) that form bounding criteria for the respective models 172, 173, 174, and 175 associated with the corners. The mid-point 271 represents a nominal value of the electrical criteria and is associated with the nominal model 171.

Although the corners 272 and 273 are illustrated having the same impedance, in other embodiments they may be different. Although the corners 274 and 275 are illustrated having the same impedance, in other embodiments they may be different.

Although the electrical criteria shown are impedance and attenuation, in other embodiments any appropriate electrical criteria may be used. Further, while the example model space 200 illustrates horizontal and vertical axes in a two-dimensional model space, in other embodiments any number (n) of axes corresponding to any number of electrical criteria may be used to form an n-dimensional model space. For example, in another embodiment, a propagation delay and/or direct current resistance of the transmission line may be used as an electrical criteria in addition to or instead of the electrical criteria shown.

Figure 3:
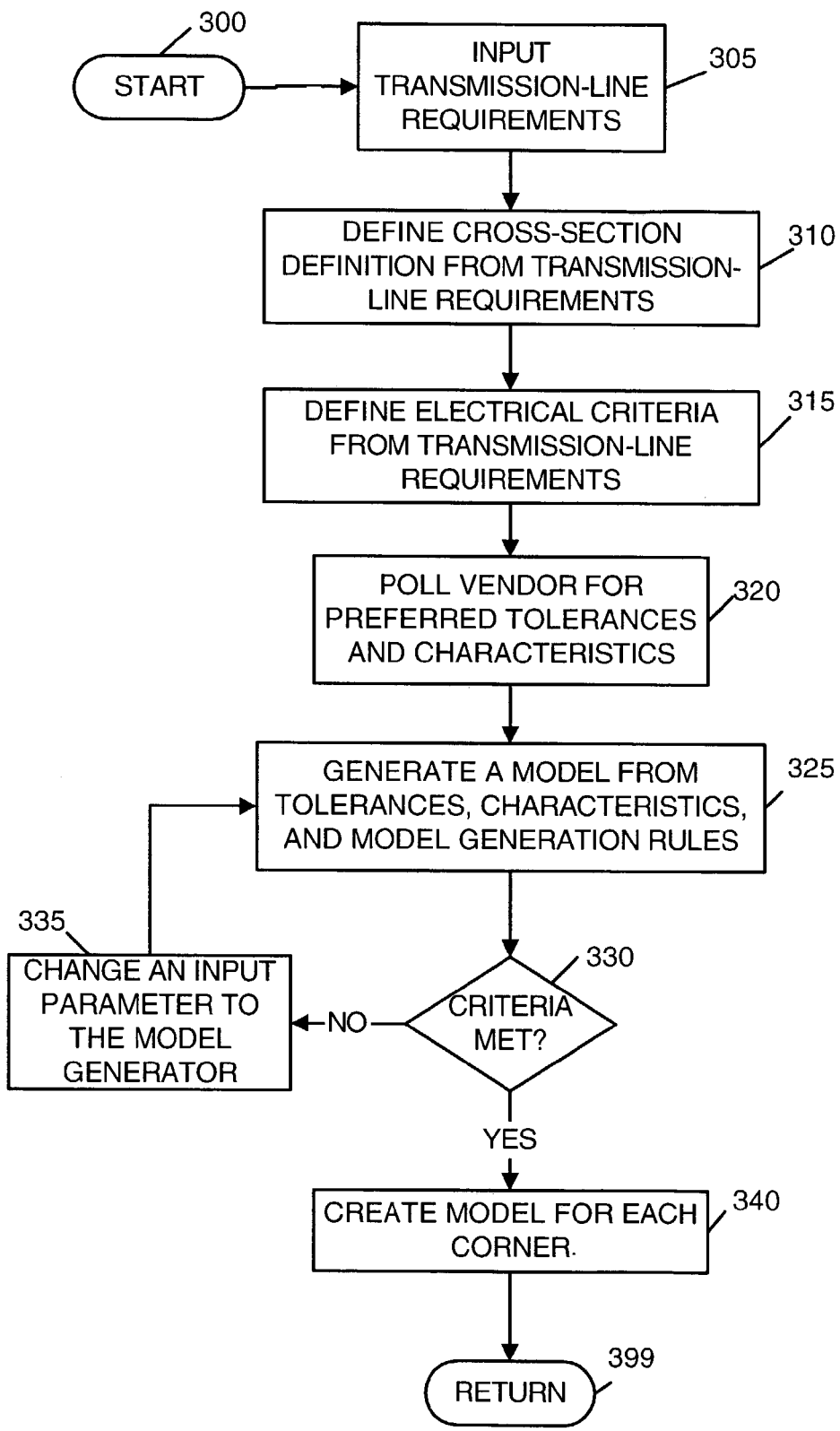
FIG. 3 depicts a flowchart of example processing for a model controller, according to an embodiment of the invention.

FIG. 3 depicts a flowchart of example processing for the model controller 126, according to an embodiment of the invention. Control begins at block 300. Control then continues to block 305 where the model controller 126 receives as input the transmission-line requirements 128. Control then continues to block 310 where the model controller 126 determines a nominal cross-section geometry from the transmission-line requirements 128.

Control then continues to block 315 where the model controller 126 defines a set of bounding electrical criteria from the transmission-line requirements data 128. The set of bounding electrical criteria specifies the allowable region of operation 205 (FIG. 2) for the transmission line models that will be generated. In an embodiment, the set of bounding electrical criteria specifies the minimum and maximum allowable characteristic impendence (Z) and attenuation (alpha), as previously described above with reference to FIG. 2. In an embodiment, impedance is used as a target specification and the characteristic attenuation of an upper or lower limit is searched for. But in another embodiment, any electrical criteria may be the target specification and any electrical criteria may be searched for. In other embodiments, any appropriate number and type of electrical criteria may be used.

Control then continues to block 320 where the model controller 126 polls a vendor to determine the vendor's preferred manufacturing tolerances and material characteristics.

Control then continues to block 325 where the model controller 126 invokes the model generator 130, which generates a transmission-line model using the model generation rules 132, values typically bounded by the preferred tolerances and characteristics previously polled at block 320, and control parameters supplied by the model controller 126. Examples of control parameters are trace width, trace thickness, trace etch-back angle, trace resistivity, dielectric thickness from the trace to the lower plane, dielectric thickness from the trace to the upper plane, a dielectric permittivity constant, dielectric loss tangent, and plane thickness. In another embodiment any appropriate control parameter may be used.

Control then continues to block 330 where the model controller 126 compares the model previously generated at block 325 to the bounding electrical criteria previously generated at block 315 and determines whether the generated model meets the bounding electrical criteria for a given corner (e.g., the corner 272, 273, 274, or 275) of the model space.

If the determination at block 330 is false, then control continues to block 335 where the model controller 126 changes one or more of the control parameters (previously described above with reference to block 325) input to the model generator 130. Control then returns to block 325 as previously described above.

If the determination at block 330 is true, then control continues to block 340 where the controller 126 assigns the current model to the corresponding corner of the model space.

The logic of FIG. 3 may be repeated for each corner of the model space and for each vendor. In another embodiment only a single vendor or any number of vendors may be used.

As an example, the following algorithm describes how the model controller 126 determines whether the generated model meets the bounding selection criteria (block 330) for the upper-left low-impedance high-attenuation model 174 corresponding to the corner 274. As the model generator 130 generates models, the model controller 126 compares the alpha-Z characteristics of each model to the following criteria:

1) is the impedance reasonably close to, but not outside (significantly less-than) the low-impedance limit (45 ohms in the example of FIG. 2), and 2) is this the maximum attenuation observed?

In an embodiment, "reasonably close to" and "significantly less" may be defined by a range that is predetermined or variable based any appropriate value. If the above two bounding criteria are satisfied, then the model controller 126 selects the current model as the model 174 for the corner 274 in the alpha-Z model space 200.

Analogously, the other three corners 172, 172, 175 have analogous selection criteria of impedance near a target limit, subject to the highest or lowest attenuation. The nominal model 171, corresponding to the center point 271 is defined by the electrical requirements in the transmission-line requirements 128.

In an embodiment, the changes to the input parameters that the model controller 126 implements at block 335 are determined prior to the start of the iterative loop illustrated by blocks 325, 330, and 335, and the model generator 128 generates models in a batch mode. In batch mode, a designer generates a table of parametric values containing various permutations on the parameters sets and submits this table to the model generator 130, which then automatically generates a corresponding batch of transmission-line models. The model controller 126 then performs the criteria determination at block 330 to find the particular model corner. Batch jobs can be useful for both gross model permutations and fine-tuning the model parameter values.

In another embodiment, the model controller 126 employs an iterative sequential model-generation-and-selection search process where the model controller 126 compares each generated model to the criteria at block 330, and based on the model's locus in a scatter-gram of the alpha-Z space, the model controller 126 changes the model input control parameters to eventfully seek out the desired electrical characteristic.

The following is an example of the sequential-seek process. While seeking the low-impedance high-attenuation corner 274, if a given model permutation yields an impedance that is too high, i.e., significantly greater than a desired impedance, then the model controller 126 diminishes the dielectric thickness input control parameter in successive model-generation sequences at block 335 until the desired impedance target is achieved, while at the same time attaining the highest attenuation, so that both criterion are met. The other corners may be pursued using an analogous algorithm. In other embodiments any of the control parameters may be adjusted, either increased or decreased. For example, trace thickness, trace width, and dielectric constant can be adjusted to achieve a specific impedance.

It is common in some embodiments that many of the models under consideration fall within the four corners of the alpha-Z space, but are rejected in the selection process (block 330) because they do not represent the bounding case for the corners 272, 273, 274, and 275 as specified by the criteria. Also, some of the models generated fall outside of the impedance specification limits defined in the requirements 128 (45 to 55 Ohms in the example shown in FIG. 2). In summary, generated models that do not meet the criteria are rejected at blocks 330 and 335, leaving the five predefined bounding-case models 171, 172, 173, 174, and 175. This selection process insures that the remaining models 171, 172, 173, 174, and 175 define the full range of printed circuit board performance (for printed circuit boards that pass the procurement specifications) and therefore in some embodiments all design simulation work can be carried out with only these four bounding models 172, 173, 174, and 175, and one nominal model 171. Hence, various embodiments of the invention allow robust, highly-refined simulations with only five models instead of dozens, which results in well-defined and realistic performance limits with design-simulation economy.

Although embodiments of the invention have been described in the context of printed circuit boards, other embodiments may be used in the context of any product where transmission lines are modeled. Other examples include, but are not limited to, flex cables, coaxial cables, chip packages, organic chip carriers, and fiber optics.

In the previous detailed description of exemplary embodiments of the invention, reference was made to the accompanying drawings (where like numbers represent like elements), which form a part hereof, and in which is shown by way of illustration specific exemplary embodiments in which the invention may be practiced. These embodiments were described in sufficient detail to enable those skilled in the art to practice the invention, but other embodiments may be utilized and logical, mechanical, electrical, and other changes may be made without departing from the scope of the present invention. Different instances of the word "embodiment" as used within this specification do not necessarily refer to the same embodiment, but they may. The previous detailed description is, therefore, not to be taken in a limiting sense, and the scope of the present invention is defined only by the appended claims.

In the previous description, numerous specific details were set forth to provide a thorough understanding of the invention. But, the invention may be practiced without these specific details. In other instances, well-known circuits, structures, and techniques have not been shown in detail in order not to obscure the invention.

What is claimed is:

1. A method comprising:
submitting a plurality of input parameter combinations to a model generator; and
selecting a subset of a plurality of transmission line models generated by the model generator, wherein the subset meets a bounding electrical criteria, wherein the bounding electrical criteria comprises a plurality of combinations of targets, wherein the plurality of combinations of targets further comprises a first minimum impedance and a first minimum attenuation, a second minimum impedance and a second maximum attenuation, a third maximum impedance and a third minimum attenuation, and a fourth maximum impedance and a fourth maximum attenuation.

2. The method of claim 1, wherein the selecting further comprises:
selecting four of the plurality of transmission line models representing four respective corners in a model space.

3. The method of claim 2, wherein the selecting further comprises:
selecting one of the plurality of transmission line models representing a mid-point within the four respective corners.

4. An apparatus comprising:
means for determining whether a transmission line model for a printed circuit board meets a bounding electrical criteria, wherein the bounding electrical criteria comprises a plurality of combinations of targets, wherein the plurality of combinations of targets further comprises a first minimum impedance and a first minimum attenuation, a second minimum impedance and a second maximum attenuation, a third maximum impedance and a third minimum attenuation, and a fourth maximum impedance and a fourth maximum attenuation; and
means for adjusting a control parameter to a model generator that generated the transmission line model when the transmission line model does not meet the bounding electrical criteria.

5. The apparatus of claim 4, wherein the control parameter is selected from a group consisting of:
a trace width, a trace thickness, a trace etch-back angle, a trace resistivity, a dielectric thickness from a trace to a lower plane, a dielectric thickness from the trace to an upper plane, a dielectric permittivity constant, a dielectric loss tangent, and a plane thickness.

6. The apparatus of claim 4, wherein the means for determining further comprises:
means for determining whether the transmission line model has an impedance within a range of a target limit; and
means for determining whether the transmission line model has a highest attenuation of a plurality of models generated by the model generator.

7. The apparatus of claim 4, further comprising:
means for determining whether the transmission line model has an impedance within a range of a target limit; and
means for determining whether the transmission line model has a lowest attenuation of a plurality of models generated by the model generator.

8. The apparatus of claim 4, wherein the means for adjusting further comprises:
means for iteratively diminishing a dielectric thickness input to the model generator until a desired impedance target is reached.

9. A signal-bearing medium encoded with instructions, wherein the instructions when executed comprise:
submitting a plurality of input parameter combinations to a model generator; and
determining that a subset of a plurality of transmission line models generated by the model generator meet a bounding electrical criteria, wherein the bounding electrical criteria comprises a plurality of combinations of targets, wherein the plurality of combinations of targets further comprises a first minimum impedance and a first minimum attenuation, a second minimum impedance and a second maximum attenuation, a third maximum impedance and a third minimum attenuation, and a fourth maximum impedance and a fourth maximum attenuation.

10. The signal-bearing medium of claim 9, wherein the plurality of combinations further comprises:
a nominal impedance and a nominal attenuation.

11. The signal-bearing medium of claim 9, wherein the electrical criteria further comprise:
propagation delay and direct current resistance.

12. The signal-bearing medium of claim 9, further comprising:
modeling a transmission line for a printed circuit board using the subset.

13. An electronic device comprising:
a processor; and
a storage device encoded with instructions, wherein the instructions when executed on the processor:
determine whether a transmission line model for a printed circuit board meets a bounding electrical criteria, wherein the bounding electrical criteria comprises a plurality of combinations of targets, wherein the plurality of combinations of targets further comprises a first minimum impedance and a first minimum attenuation, a second minimum impedance and a second maximum attenuation, a third maximum impedance and a third minimum attenuation, and a fourth maximum impedance and a fourth maximum attenuation, and
when the transmission line model does not meet the bounding electrical criteria, the instructions discard the transmission line model and adjust at least one control parameter to a model generator that generated the transmission line model.

14. The electronic device of claim 13, wherein the plurality of combinations further comprises:
a nominal impedance and a nominal attenuation.

15. The electronic device of claim 13, wherein the at least one control parameter is selected from a group consisting of:
a trace width, a trace thickness, a trace etch-back angle, a trace resistivity, a dielectric thickness from a trace to a lower plane, a dielectric thickness from the trace to an upper plane, a dielectric permittivity constant, a dielectric loss tangent, and a plane thickness.

16. The electronic device of claim 13, wherein the instructions further:
iteratively diminish a dielectric thickness input to the model generator until a desired impedance target is reached.

* * * * *